(12) United States Patent
Wu et al.

(10) Patent No.: US 7,341,761 B1
(45) Date of Patent: *Mar. 11, 2008

(54) METHODS FOR PRODUCING LOW-K CDO FILMS

(75) Inventors: Qingguo Wu, Tualatin, OR (US);
Haiying Fu, West Linn, OR (US);
Xingyuan Tang, West Linn, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/800,409

(22) Filed: Mar. 11, 2004

(51) Int. Cl.
*C23C 16/40* (2006.01)
*H05H 1/24* (2006.01)
(52) U.S. Cl. .............................. 427/255.37; 427/249.1; 427/579; 438/787; 438/788; 438/789; 438/790
(58) Field of Classification Search ........... 427/255.37, 427/249.1, 579, 99; 438/787, 788, 789, 790
See application file for complete search history.

(56) References Cited

U.S. PATENT DOCUMENTS

| | | | |
|---|---|---|---|
| 4,357,451 A | 11/1982 | McDaniel | |
| 4,882,008 A | 11/1989 | Garza et al. | |
| 4,885,262 A | 12/1989 | Ting et al. | |
| 5,504,042 A | 4/1996 | Cho et al. | |
| 5,686,054 A | 11/1997 | Barthel et al. | |
| 5,700,844 A | 12/1997 | Hedrick et al. | |
| 5,789,027 A | 8/1998 | Watkins et al. | |
| 5,849,640 A | 12/1998 | Hsia et al. | |
| 5,851,715 A | 12/1998 | Barthel et al. | |
| 5,858,457 A | 1/1999 | Brinker et al. | |
| 5,920,790 A | 7/1999 | Wetzel et al. | |
| 6,140,252 A | 10/2000 | Cho et al. | |
| 6,149,828 A | 11/2000 | Vaartstra | |
| 6,171,661 B1 | 1/2001 | Zheng et al. | |
| 6,177,329 B1 | 1/2001 | Pang | |
| 6,232,658 B1 | 5/2001 | Catabay et al. | |
| 6,258,735 B1 * | 7/2001 | Xia et al. ................... | 438/788 |
| 6,268,276 B1 | 7/2001 | Chan et al. | |
| 6,270,846 B1 | 8/2001 | Brinker et al. | |
| 6,271,273 B1 | 8/2001 | You et al. | |
| 6,306,564 B1 | 10/2001 | Mullee | |
| 6,312,793 B1 | 11/2001 | Grill et al. | |
| 6,329,017 B1 | 12/2001 | Liu et al. | |
| 6,329,062 B1 | 12/2001 | Gaynor | |
| 6,331,480 B1 | 12/2001 | Tsai et al. | |
| 6,340,628 B1 | 1/2002 | Van Cleemput et al. .... | 438/586 |
| 6,365,266 B1 | 4/2002 | MacDougall et al. | |
| 6,365,528 B1 * | 4/2002 | Sukharev et al. ........... | 438/778 |
| 6,383,466 B1 | 5/2002 | Domansky et al. | |
| 6,383,955 B1 | 5/2002 | Matsuki et al. ............. | 438/790 |
| 6,386,466 B1 | 5/2002 | Ozawa et al. | |
| 6,387,453 B1 | 5/2002 | Brinker et al. | |
| 6,391,932 B1 | 5/2002 | Gore et al. | |
| 6,392,017 B1 | 5/2002 | Chandrashekar | |
| 6,407,013 B1 * | 6/2002 | Li et al. ...................... | 438/788 |
| 6,413,583 B1 * | 7/2002 | Moghadam et al. ... | 427/249.15 |
| 6,420,441 B1 | 7/2002 | Allen et al. | |
| 6,444,715 B1 | 9/2002 | Mukherjee et al. | |
| 6,455,417 B1 | 9/2002 | Bao et al. | |
| 6,479,374 B1 | 11/2002 | Ioka et al. | |
| 6,500,770 B1 | 12/2002 | Cheng et al. | |
| 6,548,113 B1 | 4/2003 | Birnbaum et al. | |
| 6,566,278 B1 * | 5/2003 | Harvey et al. .............. | 438/778 |
| 6,572,925 B2 * | 6/2003 | Zubkov et al. ......... | 427/255.37 |
| 6,573,030 B1 | 6/2003 | Fairbairn et al. | |
| 6,576,345 B1 | 6/2003 | Van Cleemput et al. | |
| 6,596,467 B2 | 7/2003 | Gallagher et al. | |
| 6,596,654 B1 | 7/2003 | Bayman et al. | |
| 6,610,362 B1 * | 8/2003 | Towle ................... | 427/255.23 |
| 6,632,478 B2 * | 10/2003 | Gaillard et al. ......... | 427/255.37 |
| 6,662,631 B2 | 12/2003 | Baklanov et al. | |
| 6,667,147 B2 | 12/2003 | Gallagher et al. | |
| 6,677,251 B1 | 1/2004 | Lu et al. | |
| 6,715,498 B1 | 4/2004 | Humayun et al. | |
| 6,756,085 B2 | 6/2004 | Waldfried et al. | |
| 6,797,643 B2 | 9/2004 | Rocha-Alvarez et al. | |
| 6,805,801 B1 | 10/2004 | Humayun et al. | |
| 6,812,043 B2 | 11/2004 | Bao et al. | |
| 6,815,373 B2 | 11/2004 | Singh et al. | |
| 6,831,284 B2 | 12/2004 | Demos et al. | |
| 6,846,380 B2 | 1/2005 | Dickinson et al. | |
| 6,848,458 B1 | 2/2005 | Shrinivasan et al. | |
| 6,849,549 B1 | 2/2005 | Chiou et al. | |
| 6,867,086 B1 | 3/2005 | Chen et al. | |
| 6,903,004 B1 | 6/2005 | Spencer et al. | |
| 6,914,014 B2 * | 7/2005 | Li et al. ...................... | 438/781 |
| 6,943,121 B2 | 9/2005 | Leu et al. | |
| 7,018,918 B2 | 3/2006 | Kloster et al. | |

(Continued)

FOREIGN PATENT DOCUMENTS

WO WO95/07543 3/1995

(Continued)

OTHER PUBLICATIONS

U.S. Office Action mailed Dec. 27, 2005, from U.S. Appl. No. 10/789,103.

(Continued)

*Primary Examiner*—Bret Chen
(74) *Attorney, Agent, or Firm*—Beyer Weaver LLP

(57) ABSTRACT

Methods of preparing a carbon doped oxide (CDO) layers having a low dielectric constant are provided. The methods involve, for instance, providing a substrate to a deposition chamber and exposing it to one or multiple carbon-doped oxide precursors having molecules with at least one carbon—carbon triple bond, or carbon—carbon double bond, or a combination of these groups and depositing the carbon doped oxide dielectric layer under conditions in which the resulting dielectric layer has a dielectric constant of not greater than about 2.7.

14 Claims, 9 Drawing Sheets

U.S. PATENT DOCUMENTS

| | | | |
|---|---|---|---|
| 7,087,271 | B2 | 8/2006 | Rhee et al. |
| 7,094,713 | B1 | 8/2006 | Niu et al. |
| 7,098,149 | B2 | 8/2006 | Lukas et al. |
| 2002/0001973 | A1 | 1/2002 | Wu et al. |
| 2002/0016085 | A1 | 2/2002 | Huang et al. |
| 2002/0034626 | A1 | 3/2002 | Liu et al. |
| 2002/0064341 | A1 | 5/2002 | Fauver et al. |
| 2002/0106500 | A1 | 8/2002 | Albano et al. |
| 2002/0123240 | A1 | 9/2002 | Gallagher et al. |
| 2002/0132496 | A1 | 9/2002 | Ball et al. |
| 2002/0141024 | A1 | 10/2002 | Retschke et al. |
| 2002/0192980 | A1 | 12/2002 | Hogle et al. |
| 2003/0064607 | A1 | 4/2003 | Leu et al. |
| 2003/0066544 | A1 | 4/2003 | Jur et al. |
| 2003/0111263 | A1 | 6/2003 | Fornof et al. |
| 2003/0119307 | A1 | 6/2003 | Bekiaris et al. |
| 2003/0157248 | A1 | 8/2003 | Watkins et al. |
| 2003/0198895 | A1 | 10/2003 | Toma et al. |
| 2003/0224156 | A1 | 12/2003 | Kimer et al. |
| 2004/0018717 | A1 | 1/2004 | Fornof et al. |
| 2004/0069410 | A1 | 4/2004 | Moghadam et al. |
| 2004/0096586 | A1 | 5/2004 | Schulberg et al. |
| 2004/0096593 | A1* | 5/2004 | Lukas et al. ............... 427/558 |
| 2004/0096672 | A1 | 5/2004 | Lukas et al. |
| 2004/0099952 | A1 | 5/2004 | Goodner et al. |
| 2004/0101633 | A1 | 5/2004 | Zheng et al. |
| 2004/0102031 | A1 | 5/2004 | Kloster et al. |
| 2004/0102032 | A1 | 5/2004 | Kloster et al. |
| 2004/0161532 | A1* | 8/2004 | Kloster et al. ............... 427/240 |
| 2004/0170760 | A1* | 9/2004 | Meagley et al. ......... 427/248.1 |
| 2004/0185679 | A1 | 9/2004 | Ott et al. |
| 2004/0213911 | A1 | 10/2004 | Misawa et al. |
| 2004/0249006 | A1 | 12/2004 | Gleason et al. |
| 2005/0064698 | A1* | 3/2005 | Chang et al. ............... 438/623 |
| 2005/0095840 | A1 | 5/2005 | Bhanap et al. |
| 2005/0230834 | A1 | 10/2005 | Schmitt et al. |
| 2006/0040507 | A1 | 2/2006 | Mak et al. |
| 2006/0105566 | A1 | 5/2006 | Waldfried et al. |
| 2006/0110931 | A1 | 5/2006 | Fukazawa et al. |
| 2006/0145305 | A1 | 7/2006 | Boyanov et al. |
| 2006/0178006 | A1 | 8/2006 | Xu et al. |
| 2006/0197881 | A1 | 9/2006 | Kang et al. |

FOREIGN PATENT DOCUMENTS

| | | | |
|---|---|---|---|
| WO | WO 03/005429 | A1 * | 1/2003 |
| WO | WO 03/052794 | A2 | 6/2003 |

OTHER PUBLICATIONS

U.S. Office Action mailed Feb. 7, 2006, from U.S. Appl. No. 10/672,305.
U.S. Office Action mailed Dec. 20, 2005, from U.S. Appl. No. 10/672,311.
U.S. Office Action mailed Dec. 20, 2005, from U.S. Appl. No. 10/849,568.
U.S. Office Action mailed Jan. 9, 2006, from U.S. Appl. No. 10/785,235.
U.S. Office Action mailed Feb. 28, 2006, from U.S. Appl. No. 10/404,693.
Subramonium et al., "Pulsed PECVD Method for Modulating Hydrogen Content in Hard Mask", U.S. Appl. No. 11/318,269, filed Dec. 23, 2005.
Jan, C.H., et al., *90NM Generation, 300mm Wafer Low k ILD/Cu Interconnect Technology*, 2003 IEEE Interconnect Technology Conference.
U.S. Appl. No. 10/820,525, entitled: Methods for Producing Low-K CDO Films With Low Residual Stress, Wu et al.
Cho et al., "Plasma Treatments of Molecularly Templated Nanoporous Silica Films," Electrochemical and Solid-State Letters, 4 (4) G35-G38 (2001).
Yung et al., "Spin-on Mesoporous Silica Films with Untralow Dielectric Constants, Ordered Pore Structures, and Hydrophobic Surfaces," Adv. Mater. 2001, 13, No. 14, 1099-1102.
Schulberg et al., "System for Deposition of Mesoporous Materials," U.S. Appl. No. 10/295,965, filed Nov. 15, 2002, 64 pages.
Watkins et al., "Mesoporous Materials and Methods," U.S. Appl. No. 10/301,013, filed Nov. 21, 2002, 34 pages.
Justin F. Gaynor, "In-Situ Treatment of Low-K Films With a Silylating Agent After Exposure To Oxidizing Environments," U.S. Appl. No. 10/056,926 filed Jan. 24, 2002, 34 pages.
Humayun et al., "Method for Forming Porous Films By Porogen Removal Combined With In SITU Surface Modification", Novellus Corporation, U.S. Appl. No. 10/404,693, filed Mar. 31, 2003, pp. 1-32.
Tipton et al., "Method Of Porogen Removal From Porous Low-K Films Using UV Radiation", Novellus Systems, Inc., U.S. Appl. No. 10/672,311, filed Sep. 26, 2003, pp. 1-27.
U.S. Appl. No. 10/016,017, filed Dec. 12, 2001.
U.S. Appl. No. 10/125,614, filed Apr. 18, 2002.
U.S. Appl. No. 10/202,987, filed Jul. 23, 2002.
Tipton et al., "Method for Removal of Porogens From Porous Low-K Films Using Supercritical Fluids", Novellus Systems, Inc., U.S. Appl. No. 10/672,305, filed Sep. 26, 2003, pp. 1-32.
Gangpadhyay et al., "The First International Surface Cleaning Workshop," Northeastern University, Nov. 11-14, 2002.
Cho et al., "Method and Apparatus for UV Exposure of Low Dielectric Constant Materials for Porogen Removal and Improved Mechanical Properties", Novellus Systems, Inc., U.S. Appl. No. 10/800,377, filed Mar. 11, 2004, pp. 1-31.
Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.
Humayun et al., "Method For Forming Porous Films By Porogen Removal Combined With In Situ Modification", U.S. Appl. No. 10/404,693, filed Mar. 31, 2003, Office Action dated Mar. 15, 2005.
Tipton et al., "Method Of Porogen Removal From Porous Low-K Films Using UV Radiation", U.S. Appl. No. 10/672,311, filed Sep. 26, 2003, Office Action dated Sep. 7, 2004.
Tipton et al., "Method Of Porogen Removal From Porous Low-K Films Using UV Radiation", U.S. Appl. No. 10/672,311, filed Sep. 26, 2003, Office Action dated Dec. 28, 2004.
Tipton et al., "Method For Removal Of Porogens From Porous Low-K Films Using Supercritical Fluids", U.S. Appl. No. 10/672,305, Office Action dated Mar. 22, 2005.
Bandopadhyay et al., "Method to Improve Mechanical Strength of Low-K Dielectric Film Using Modulated UV Exposure", U.S. Appl. No. 10/825,888, filed Apr. 16, 2004.
R.D. Miller et al., "Phase-Separated Inorganic-Organic Hybrids for Microelectronic Applications," MRS Bulletin, Oct. 1997, pp. 44-48.
Jin et al., "Nanoporous Silica as an Ultralow-*k* Dielectric," MRS Bulletin, Oct. 1997, pp. 39-42.
Asoh et al., "Fabrication of Ideally Ordered Anodic Porous Alumina with 63 nm Hole Periodocity Using Sulfuric Acid," J. Vac. Sci. Technol. B 19(2), Mar./Apr. 2001, pp. 569-572.
Asoh et al., "Conditions for Fabrication of Ideally Ordered Anodic Porous Alumina Using Pretextured AI," Journal of the Electrochemica Society, 148 (4) B152-B156 (2001) pp. B152-B156.
Holland et al., "Nonlinthographic Technique for the Production of Large Area High Density Gridded Field Sources," J. Vac. Sci. Technol. B 17(2), Mar./Apr. 1999, pp. 580-582.
Masuda et al., "Highly Ordered Nanochannel-Array Architecture in Anodic Alumina," App. Phys. Lett. 71(19), Nov. 1997, pp. 2770-2772.
Clube et al., White Paper from Holotronic Technologies SA; downloaded from www.hdotronic.com/whitepaper/fine-patt.pdf on Mar. 12, 2002.
Meli et al., "Self-Assembled Masks for the Transfer of Nanometer-Scale Patterns into Surfaces: Characterization by AFM and LFM", Nano Letters, vol. 2, No. 2, 2002, 131-135.
"Shipley Claims Porous Low K Dielectric Breakthrough," Press Release Mar. 17, 2003.

Jeffrey M. Calvert and Michael K. Gallagher, Semiconductor International, 26 (12), 56 (2003).

Van Bavel et al., Future Fab International, 16, (2004).

Caluwaerts et al, "Post Patterning Meso Porosity Creation: A Potential Solution For Pore Sealing," IITC 2003.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

Varadarajan, et al., "Strained Transistor Architecture and Method", Novellus Systems, Inc., U.S. Appl. No. 10/923,259, filed Aug. 20, 2004, pp. 1-24.

Niu et al., "Methods For Improving The Cracking Resistance Of Low-K Dielectric Materials", U.S. Appl. No. 10/860,340, filed Jun. 2, 2004.

Niu et al., "Methods For Improving The Cracking Resistance Of Low-K Dielectric Materials", U.S. Appl. No. 10/860,340, Office Action dated Mar. 2, 2005.

Niu et al., "Methods For Improving The Cracking Resistance Of Low-K Dielectric Materials", U.S. Appl. No. 10/860,340, Final Office Action dated Jun. 13, 2005.

Wang et al., "Plasma Detemplating And Silanol Capping Of Porous Dielectric Films", U.S. Appl. No. 10/785,235, filed Feb. 23, 2004.

Varadarajan et al., "Tensile Dielectric Films Using UV Curing", U.S. Appl. No. 10/972,084, filed Oct. 22, 2004.

Fox et al., "Method For Improving Mechanical Properties Of Low Dielectric Constant Materials", U.S. Appl. No. 10/849,568, filed May 18, 2004.

Fox et al., "Methods For Producing Low-Stress Carbon-Doped Oxide Films With Improved Integration Properties", U.S. Appl. No. 10/987,208, filed Nov. 12, 2004.

Van Den Hoek et al., "VLSI Fabrication Processes For Introducing Pores Into Dielectric Materials," U.S. Appl. No. 11/050,621, filed Jan. 31, 2005.

Draeger et al., "Creation Of Porosity In Low-K Films By Photo-Disassociation Of Imbedded Nanoparticles," U.S. Appl. No. 11/146,456, filed Jun. 6, 2005.

Wu et al., "Methods For Producing Low Stress Porous Low-K Dielectric Materials Using Precursors With Organic Functional Groups", U.S. Appl. No. 10/927,777, filed Aug. 27, 2004.

Wu et al., "Methods For Improving Integration Performance Of Low Stress CDO Films", U.S. Appl. No. 10/941,502, filed Sep. 14, 2004.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

Wu et al., U.S. Appl. No. 10/789,103, entitled: Methods For Producing Low-K CDO Films With Low Residual Stress.

U.S. Office Action mailed Jul. 13, 2005, from U.S. Appl. No. 10/672,311.

U.S. Office Action mailed Jul. 27, 2005, from U.S. Appl. No. 10/785,235.

U.S. Office Action mailed Aug. 24, 2005, from U.S. Appl. No. 10/404,693.

U.S. Office Action mailed Sep. 1, 2005, from U.S. Appl. No. 10/672,305.

Cho et al., "Method for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

U.S. Office Action mailed Mar. 29, 2006, from U.S. Appl. No. 10/800,377.

U.S. Office Action mailed May 31, 2006, from U.S. Appl. No. 10/941,502.

U.S. Office Action mailed May 30, 2006, from U.S. Appl. No. 10/785,235.

U.S. Office Action mailed May 31, 2006, from U.S. Appli. No. 10/849,568.

U.S. Office Action mailed May 2, 2006, from U.S. Appl. No. 11/050,621.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed May 2, 2006, from U.S. Appl. No. 10/295,965.

U.S. Office Action mailed Aug. 9, 2005, from U.S. Appl. No. 10/295,965.

U.S. Office Action mailed Jun. 14, 2006, from U.S. Appl. No. 10/789,103.

U.S. Office Action mailed Sep. 8, 2006, from U.S. Appl. No. 10/404,693.

U.S. Office Action mailed Sep. 7, 2006, from U.S. Appl. No. 10/820,525.

U.S. Office Action mailed Jul. 12, 2006, from U.S. Appl. No. 10/672,305.

Wu et al., "Methods for Fabricating High Hardness/Modules Low Dielectric Constant Materials," Novellus Systems, Inc., U.S. Appl. No. 11/369,658, filed Mar. 6, 2006, pp. 1-33.

Dhas et al., "Method of Reducing Defects in PECVD TEOS Films," Novellus Systems, Inc., U.S. Appl. No. 11/396,303, filed Mar. 30, 2006, pp. 1-21.

U.S. Office Action mailed Nov. 30, 2006, from U.S. Appl. No. 10/927,777.

U.S. Office Action mailed Mar. 28, 2007, from U.S. Appl. No. 10/820,525.

U.S. Office Action mailed Jan. 24, 2007, from U.S. Appl. No. 10/789,103.

U.S. Office Action mailed Jun. 21, 2007, from U.S. Appl. No. 10/789,103.

Niu et al., "Methods for Improving the Cracking Resistance of Low-K Dielectric Materials," Novellus Systems, Inc. U.S. Appl. No. 11/376,510, filed Mar. 14, 2006, pp. 1-28.

U.S. Office Action mailed May 22, 2007, from U.S. Appl. No. 11/376,510.

U.S. Notice of Allowance and Fee Due mailed Apr. 9, 2007, from U.S. Appl. No. 10/927,777.

Allo Claims from U.S. Appl. No. 10/927,777.

U.S. Final Office Action mailed Apr. 3, 2007, from U.S. Appl. No. 10/941,502.

U.S. Notice of Allowance and Fee Due mailed Dec. 20, 2005, from U.S. Appl. No. 10/860,340.

Wu et al., "PECVD Methods for Producing Ultra Low-K Dielectric Films Using UV Treatment, " Novellus Systems, Inc., U.S. Appl. No. 11/608,056, filed Dec. 7, 2006, pp. 1-34.

Wu et al., "Methods for Improving Performance of ODC Films with Dielectric Constant <4.0," , Novellus Systems, Inc., U.S. Appl. No. 11/693,661, filed Mar. 29, 2007, pp. 1-46.

* cited by examiner

METHODS FOR PRODUCING LOW-K CDO FILMS

CROSS REFERENCE TO RELATED APPLICATIONS

This application is related to U.S. patent application Ser. No. 10/789,103 filed on Feb. 17, 2004, naming Wu et al, as inventors and titled "METHODS FOR PRODUCING LOW-K CDO FILMS WITH LOW RESIDUAL STRESS," which claims priority from U.S. Provisional Patent Application No. 60/524,330, filed on Nov. 20, 2003, naming Wu et al. as inventors and title "METHODS FOR PRODUCING LOW-K CDO FILM OF LOW RESIDUE STRESS WITH DIELECTRIC CONSTANT <3.0," both of which are incorporated herein by reference for all purposes.

FIELD OF THE INVENTION

This invention relates to methods for preparing dielectric films having low dielectric constants and high mechanical strength.

BACKGROUND

There is a general need for materials with low dielectric constants (low-k) in the integrated circuit manufacturing industry. Using low-k materials as the interlayer dielectric of conductive interconnects reduces the delay in signal propagation and signal crosstalk due to capacitive effects. The lower the dielectric constant of the dielectric, the lower the capacitance of the dielectric and the RC delay in the lines and signal crosstalk between electrical lines of the IC. Further, the use of low k materials as interlayer dielectrics will reduce power consumption of complex integrated circuits.

Low-k dielectrics are conventionally defined as those materials that have a dielectric constant (k) lower than that of silicon dioxide ($SiO_2$), that is k<~4. Generally, they have a dielectric constant of 3 or less. Typical methods of obtaining low-k materials include introducing pores into the dielectric matrix and/or doping silicon dioxide with various hydrocarbons or fluorine. In technology nodes of 90 nanometers and beyond (e.g., 65 nanometers), carbon doped oxide dielectric materials look extremely promising. However, wide spread deployment of these materials in modern integrated circuit fabrication processes is hindered by increasing demands for high mechanical strength coupled with lower dielectric constants. For certain applications, it is now necessary to use dielectric materials having k values below about 2.7.

SUMMARY

In one aspect of the invention, a carbon doped oxide (CDO) film containing carbon—carbon double bonds or carbon—carbon triple bonds or both is applied to a substrate by contacting the substrate with one or more CDO precursors having a carbon—carbon double bond, a carbon—carbon triple bond, or both. Because of the choice of precursors, the resulting film will have good mechanical properties while possessing a dielectric constant of not greater than about 2.7. In some implementations of the invention, the CDO film serves as an interlayer dielectric in an integrated circuit.

In a specific embodiment, the invention provides a method of preparing a carbon doped silicon oxide (CDO) film on a substrate. The method may be characterized by the following sequence: (a) providing the substrate to a deposition chamber; and (b) contacting the substrate with one or more CDO precursors, at least one of which contains some degree of unsaturation (e.g., a carbon—carbon triple bond or a carbon—carbon double bond). The method is conduced under process conditions in which the CDO film contains carbon—carbon triple bonds and has a dielectric constant of at most about 2.7 (preferably not greater than about 2.6). In some embodiments of commercial importance, the substrate is a partially fabricated integrated circuit, and the CDO film is, for example, interlayer dielectric.

Regarding the as deposited CDO film, preferably it has a carbon—carbon triple bond to silicon-oxygen bond ratio of about 0.05% to 20% based on FTIR peak areas. Typically, the film will also include derivative bond structures of carbon—carbon triple bonds such as carbon—carbon double bonds, carbon—carbon single bonds, and their crosslinked forms within the Si—O—Si matrix.

Many precursors and process gas compositions will be suitable for this invention. One or multiple CDO precursors may be employed. If only a single CDO precursor is employed, then it should include an unsaturated group (e.g., a carbon—carbon triple bond). In a specific embodiment, a single CDO precursor is a silane having at least one hydrocarbon group with a triple bond and at least one alkyl group or a bis(alkylsilyl)acetylene. A more specific set of examples includes ethynyltrimethylsilane (ETMS), propargyltrimethylsilane (PTMS), propargyloxytrimethylsilane (POTMS), bis(trimethylsilyl)acetylene (BTMSA), 1,3-diethynyltetramethyldisiloxane (DTDS), dimethylmethoxysilaneacetylene (DMMOSA), methyldimethoxysilaneacetylene (MDMOSA), dimethylethoxysilaneacetylene (DMEOSA), methyldiethoxysilaneacetylene (MDEOSA), ethyldiethoxysilaneacetylene (EDEOSA), and dimethylsilane-diacetylene (DMSDA).

For CDO deposition, the process gas should include a source of carbon, oxygen, silicon, and hydrogen. These elements can be found in the carrier gas, the precursor(s), and/or a separate oxidizer. In cases where at least two different precursors are employed, the primary CDO precursor may be an alkylsiloxane and the secondary CDO precursor may include the carbon—carbon triple bond. The secondary precursor may also include a carbon—carbon double bond. Examples include 1,3-divinyltetramethyldisiloxane (DVDS), vinyltrimethylsilane (VTMS), vinylmethyldimethoxysilane (VMDMOS), and divinyldimethylsilane (DVDMS). Specific examples of carrier gases include carbon dioxide, oxygen, ozone, nitrous oxide, hydrogen peroxide, helium, argon, and other inert gases Another aspect of this invention pertains to integrated circuits having a carbon doped silicon oxide (CDO) dielectric layer containing carbon—carbon triple bonds and having a dielectric constant of not greater than about 2.7 (preferably not greater than about 2.6). In many embodiments, the CDO dielectric layer serves as an interlayer dielectric in the integrated circuit. And frequently the integrated circuit contains multiple CDO dielectric layers, each having carbon—carbon triple bonds.

In addition to having a low dielectric constant, the CDO film preferably has robust mechanical properties. For example, the film preferably has a cracking threshold of greater than 3 micrometers. Also, the film may have a modulus of not less than about 3 MPa.

These and other features and advantages of the invention will be presented in more detail below with reference to the associated drawings.

DETAILED DESCRIPTION OF A PREFERRED EMBODIMENT

Introduction and Overview

The present invention relates to methods of creating low-k carbon doped oxide (CDO) layers with high mechanical strength and low residual stress. Generally, CDO film refers to a material whose compositional elements include Si, O, C and H. It may contain traces of other elements, including fluorine (F) or germanium (Ge). "Low-k", in the context of this invention means that the dielectric constant of the CDO layer is not greater than about 3.5 and preferably not greater than about 2.7. In particularly preferred embodiments, the CDO layer has a dielectric constant of at most about 2.6.

It has been found that rigid chemical bonds such as carbon—carbon double bonds and carbon—carbon triple bonds strengthen a solid's matrix and generate additional free space (a nanometer scale pore space), thereby lowering the k value of the solid's dielectric constant. Thus, in one aspect, the present invention provides CDO films including at least some carbon—carbon triple bonds and their derivative forms. These derivative forms of triple bonds include carbon—carbon double bonds, carbon—carbon single bonds, and their crosslinked forms with other compositional atoms, including Si, O, C and H, in a CDO film. As discussed below, the incorporation of carbon—carbon triple bond in the CDO film can be detected using, for example, Fourier Transformation Infrared (FTIR) spectrometry. The content of carbon—carbon triple bond in the CDO film can be quantitatively described by the ratio of its FTIR peak area centered at ~2100 cm$^{-1}$ to the FTIR peak area of main backbone Si—O—Si matrix centered at ~1020 cm$^{-1}$. Preferably, the ratio of FTIR C≡C triple bond peak area to Si—O bond peak area will fall in the range of about 0.05% to 20%, more preferably in the range of about 0.3% to 7%.

Figure 1:
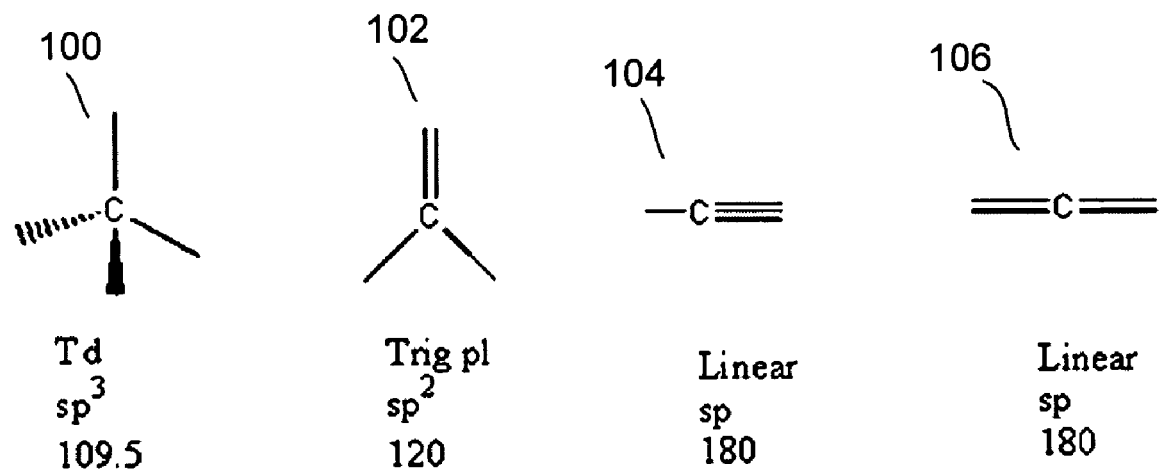
FIG. 1 is a diagram of four major structural configurations for carbon in CDO films.

The advantages gained by introducing these unsaturated groups can be understood as follows. There are four major structural configurations for carbon in CDO films. By way of illustration, FIG. 1 illustrates these configurations. The sp$^3$ structure 100 has the most degrees of freedom while the other three formats (sp$^2$ format 102 and sp formats 104 and 106) have fewer degrees of freedom and thus have more rigidity. Due to the reactive nature of deposition process and carbon—carbon triple bonds, not only triple bonds themselves but also their derivative forms will be present in CDO films. These derivative forms result from the opening of one or two of the triple bond to form carbon—carbon double bond or carbon—carbon bond, and/or crosslinking to Si—O—Si network. The sp$^2$ and sp structures comprise C=C or C≡C bonds and have significantly different atom—atom of distance than C—C, C—O, Si—O, or Si—C bonds do. Nominal bond length of C—C bond is ~1.5 Angstroms, that of C=C bond is ~1.3 Angstroms and that of C≡C bond is ~1.2 Angstroms, that of C—O bond is ~1.1 Angstroms while the nominal bond length of Si—O bond is ~1.6 Angstroms and that of Si—C bond is ~1.9 Angstroms. Because of their rigidity and bond lengths, the C=C or C≡C bonds (and their derivative forms) provide means to alter the Si—O—Si matrix structure and to engineer the lattice structure of CDO films in order to lower the stress commonly associated with the CDO film and increase the nanometer scale pore space in the CDO matrix.

The total residual stress of the CDO films produced using these precursors and methods (precursor and/or process optimization) is preferably less than about 50 MPa tensile stress, and more preferably less than about 30 MPa tensile stress. It has also been demonstrated that the resulting film may have a compressive stress rather then a tensile stress (which is usually shown as a negative number). If the film exhibits a net intrinsic compressive stress, the magnitude of that compressive stress is preferably less than about –25 MPa, and more preferably less than –20 MPa compressive. One suitable apparatus used to measure internal stress is the "Flexus" tool purchased from KLA-Tencor Corporation. But any tool that accurately measures bow or other deviation from planarity in a wafer can be employed.

The films preferably possess a variety of other mechanical properties rendering them suitable for integration in demanding IC fabrication processes. Examples of such other mechanical properties include hardness, modulus, blanket film cracking limit, fracture toughness (resistance to crack propagation after a crack is initiated) and cracking propagation velocity. Hardness and modulus are well defined within the art and will not be discussed in detail herein. Measures of film hardness and modulus presented herein may be made with any suitable apparatus including a nano-indentation device. In the context of the present invention, a desirable modulus range is higher than about 3 GPa, most preferably higher than about 6 GPa One manifestation of residual tensile stress in a film is cracking. A film's cracking threshold is a measure of the thickness of the film on a blank substrate (e.g., a flat 200 mm wafer) that can be deposited without forming a crack. In a typical experiment, the dielectric film is deposited to various thicknesses using a single set of process conditions. The resulting wafer (with dielectric layer) is set aside without disturbance for a period of time (e.g., one day) and examined for cracks. The greatest thickness at which no crack is observed is the cracking threshold. For many processes, the cracking threshold is measured in µm. For the purposes of this invention, the cracking threshold is greater than about 3 µm. Most preferably, the cracking threshold is greater than about 5 µm.

Another physical property of relevance to the CDO film is its refractive index, an indication of how much carbon related bonds are in the film. This value has a bearing on the etch sensitivity of the resulting film. For many applications, it is desired that the CDO film be relatively easy to etch relative to the barrier or etch stop layer used together with CDO film during the IC fabrication. In this regard, the refractive index of CDO film should be at most about 1.6. More preferably, it is at most about 1.55 (e.g., between about 1.3 and 1.5.). Refractive index can be measured by many types of optical inspection tools, including ellipsometers and reflectometers.

Note that the CDO films described in this application are composed of, at least, silicon, oxygen, hydrogen, and carbon. The typical chemical composition of the as deposited CDO films includes 10–25 atomic percentage silicon, 10–60 atomic percentage oxygen, 10–50 atomic percentage carbon and 20–35 atomic percentage of hydrogen. In some embodiments, other elements may be present in the CDO films.

Figure 2:
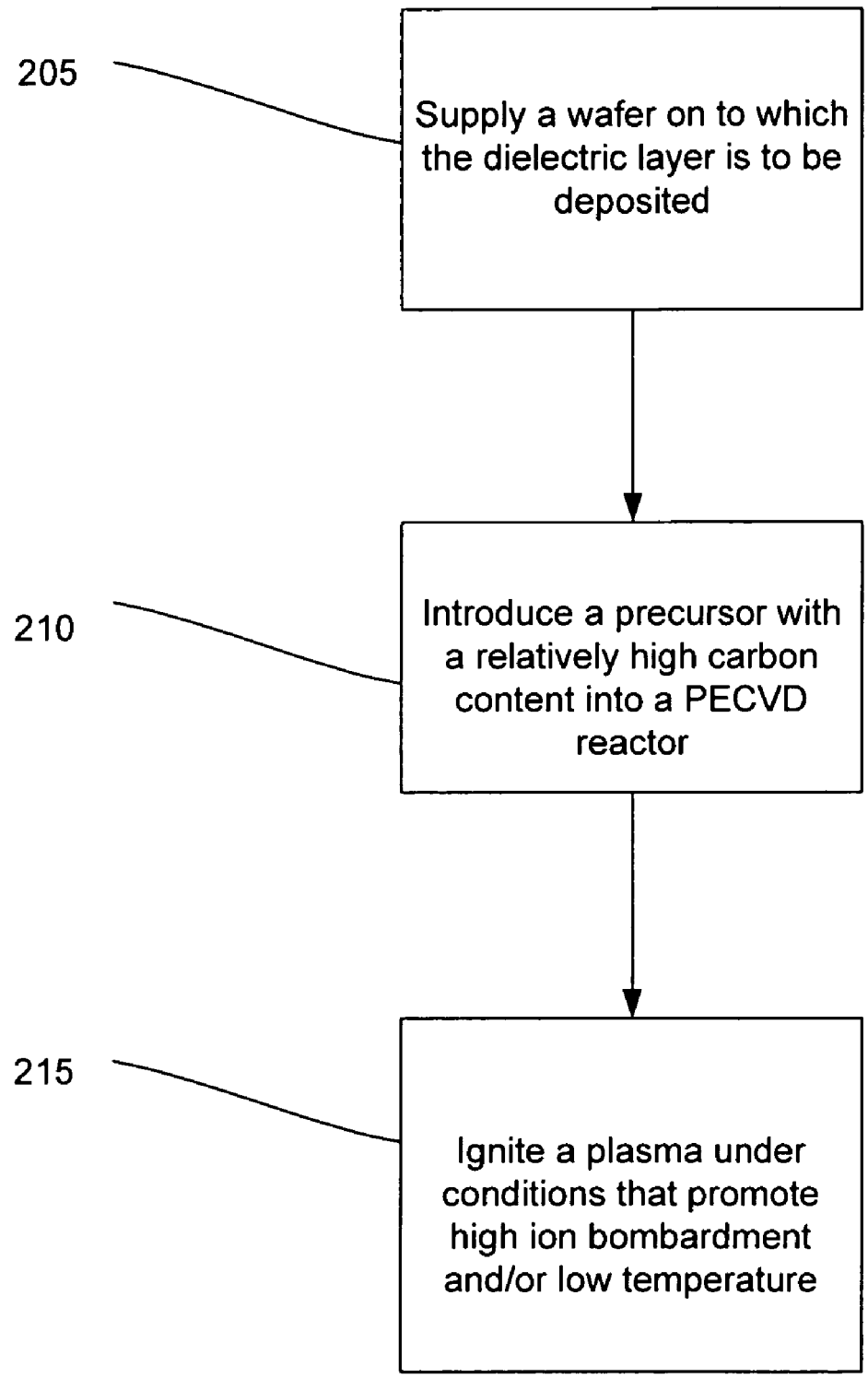
FIG. 2 is a flowchart illustrating the basic method for creating low-k CDO dielectric layers with low residual stress and high hardness/modulus.

FIG. 2 is a flowchart illustrating at a high level one methodology for creating low-k (a dielectric constant of below about 2.7) CDO dielectric layers in accordance with this invention. In a step 205 a wafer is supplied. In step 210, one or more precursors are introduced. Precursors are chosen to have a high carbon content and, in some embodiments, one or more double bonds or triple bonds. In step 215, plasma is ignited under conditions that promote incorporation of desired compositional bond structure in the CDO film. Selection of precursors employed in step 210 is detailed in the Precursor Optimization section below. Step 215 is described in detail in the Process Optimization section, also below.

Precursor Optimization

Both process optimization and precursor selection can have strong effects on the material properties of the film. Precursors of interest should be carbon rich and contain some degree of unsaturation (e.g., at least one carbon—carbon triple bond or double bond). Generally, carbon may be provided in the form of alkyl groups, alkene groups, and alkyne groups for example. For many applications, it will be desirable to choose at least one precursor that has at least two carbon-silicon bonds per silicon atom. Precursors having any of these enumerated properties may be used alone (in a process gas having a single precursor) or in combination with other precursors Examples of principal precursors for CDO dielectrics of this invention include silane (in combination with a carbon containing precursor), alkylsilanes (e.g., trimethylsilane and tetramethylsilane), alkoxysilanes (e.g., methyltriethoxysilane (MTEOS), methyltrimethoxysilane (MTMOS) diethoxymethylsilane (DEMS), methyldimethoxysilane (MDMOS), trimethylmethoxysilane (TMMOS) and dimethyldimethoxysilane (DMDMOS)), linear siloxanes (e.g., diethoxymethylsilane), cyclic siloxanes (e.g. alkylcyclotetrasiloxanes such as octamethylcyclotetrasiloxane (OMCTS) and tetramethylcyclotetrasiloxane (TMCTS)), and various compounds with silyl groups. Note that one example of a silane is di-tert-butylsilane. In each class of compounds, the precursor may be entirely saturated or it may include one or more carbon—carbon triple bonds or double bonds. If the precursor is entirely saturated, then the process gas will require a secondary precursor that contains carbon—carbon double bonds or carbon—carbon triple bonds.

Precursors having carbon—carbon triple bonds or double bonds may be found in various classes of compound including, for example, silanes having at least one hydrocarbon group with a carbon—carbon double bond and at least one alkyl group or at least one oxy-hydrocarbon group, silanes having at least one hydrocarbon group with a carbon—carbon triple bond and at least one alkyl group or at least one oxy-hydrocarbon group, bis(alkylsilyl) acetylenes, bis (alkylsilyl) ethylenes, and siloxanes having pendant hydrocarbon groups with a carbon—carbon triple bond or double bond. Several silicon-containing hydrocarbons (with or without oxygen) have been identified as potential precursors that may be used in a deposition process to form CDO films having low dielectric constants. These include the following:

Ethynyltrimethylsilane ($SiC_5H_{10}$): ETMS, also known as trimethylsilaneacetylene (TMSA), $(CH_3)_3Si—C\equiv C—H$ Propargyltrimethylsilane ($SiC_6H_{12}$): PTMS, $(CH_3)_3Si—CH_2—C\equiv C—H$ Propargyloxytrimethylsilane ($SiC_6H_{12}O$): POTMS, $(CH_3)_3Si—O—CH_2—C\equiv C—H$ Bis(trimethylsilyl)acetylene ($Si_2C_8H_{18}$): BTMSA, $(CH_3)_3Si—C\equiv C—Si(CH_3)_3$ Bis(trimethylsilyl)methylene ($Si_2C_7H_2O$): BTMSM, $(CH_3)_3S_1—CH_2—Si(CH_3)_3$ Bis(trimethylsilyl)ethylene ($Si_2C_8H_{22}$): BTMSE, $(CH_3)_3S_1—CH_2—CH_2—Si(CH_3)_3$ 1,3-Diethynyltetramethyldisiloxane ($Si_2C_8H_{14}O$): DTDS, $HC\equiv C—Si(CH_3)_2—O—Si(CH_3)_2—C\equiv C—H$ 1,3-Divinyltetramethyldisiloxane ($Si_2C_8H_{18}O$): DVDS, $H_2C=CH—Si(CH_3)_2—O—Si(CH_3)_2—CH=CH_2$ Vinyltrimethylsilane ($SiC_5H_{12}$): VTMS, $(CH_3)_3Si—CH=CH_2$ Vinylmethyldimethoxysilane ($SiC_5H_{12}O_2$): VMDMOS, $(CH_3O)_2(CH_3)Si—CH=CH_2$ Dimethylmethoxysilaneacetylene ($SiC_5H_{11}O$): DMMOSA, $(CH_3O)(CH_3)_2Si—C\equiv CH$ Methyldimethoxysilaneacetylene ($SiC_5H_{11}O_2$): MDMOSA, $(CH_3O)_2(CH_3)Si—C\equiv CH$ Dimethylethoxysilaneacetylene ($SiC_6H_{13}O$): DMEOSA, $(C_2H_5O)(CH_3)_2Si—C\equiv CH$ Methyldiethoxysilaneacetylene ($SiC_7H_{15}O_2$): MDEOSA, $(C_2H_5O)_2(CH_3)Si—C\equiv CH$ Ethyldiethoxysilaneacetylene ($SiC_8H_{17}O_2$): EDEOSA, $(C_2H_5O)_2(C_2H_5)Si—C\equiv CH$ Dimethylsilane-diacetylene ($SiC_6H_8$): DMSDA, $(CH_3)_2Si(C\equiv CH)_2$ Divinyldimethylsilane ($SiC_6H_{12}$): DVDMS, $(CH_3)_2Si(CH=CH_2)_2$ Methylsilane-triacetylene ($SiC_7H_6$): MSTA, $(CH_3)Si(C\equiv CH)_3$ Tetraacetylene Silane ($SiC_8H_4$): TAS, $Si(C\equiv CH)_4$ The functional groups are C=C (double bonds) and C≡C (triple bonds) which may be pendant or embedded within other functionalities. Preferably, the desired functional group in the precursor(s) is the C≡C (triple bonds). During deposition, these special functional groups become integrated in the CDO film on the substrate. Rigid C≡C and/or C=C bonds, and their derivative bonding structures through crosslinking with Si, O, and C, when embedded in the CDO film, strengthen the material matrix and alter Si—O—Si backbone structure of CDO films, resulting in a more rigid lattice, thus lowering the tensile stress of the CDO film. As presented below, the incorporation of C=C and C≡C bond and their derivative forms within the Si—O—Si structure was observed by FTIR and other analytical methods. As mentioned, such films may be formed from a single carbon-containing precursor or multiple precursors in combination. Obviously, if a single precursor is used, then it must contain at least one carbon—carbon triple or double bond. But if multiple precursors are used in combination, it is not necessary for each of them to include an unsaturated group. Various primary precursors may be employed which have no double bonds or triple bonds.

Examples of secondary precursors include relatively small molecules having 2 to 6 carbon atoms and one or more carbon—carbon double bonds or carbon—carbon triple bonds. Specific examples include $C_3H_4$: $CH_3$—C≡C—H, $C_2H_2$: H—C≡C—H, $C_2H_4$: $CH_2$=$CH_2$, $C_3H_6$: $CH_2CHCH_3$, $C_3H_4$: $CH_2$=C=$CH_2$, Cyclopropene ($H_2$CCHCH), 1,3,5-Hexatriene ($C_6H_8$—$CH_2$=CH: CH=CH: CH=$CH_2$), and 2-Methyl-1-buten-3-yne ($C_5H_6$—$CH_2$=C($CH_3$):C≡C—H). Other potential candidates for secondary precursors are silicon-containing hydrocarbons, or oxygen-containing hydrocarbons.

The precursor, in liquid or gaseous form, is but one component of the process chemicals employed during deposition. The process chemicals are those gases or liquids introduced into a reactor, such as a chemical vapor deposition (CVD) reactor, to allow deposition of the CDO film. Generally, the process gases will include at least a carrier gas and one or more precursor gases/liquids introduced to the reaction chamber via the carrier gas. At least one of the precursors or the carrier gas should act as a source of oxygen. The source of silicon usually comes from a precursor gas/liquid. The hydrocarbon groups for the CDO film (including groups containing carbon—carbon double bonds and triple bonds) may come from either the precursor chemical(s) or the carrier gas, as indicated.

Generally, the carrier gas is provided in much greater volumes than the precursor gases. It is used as a delivery vehicle and a means for sweeping precursor materials and byproducts through the reactor. Various oxygen containing gases such as molecular oxygen ($O_2$), ozone ($O_3$), hydrogen peroxide ($H_2O_2$), nitrous oxide ($N_2O$) and carbon dioxide ($CO_2$) may be used. Carbon dioxide is preferred for many applications of this invention. In some embodiments hydrogen is used as the carrier gas. In still other embodiments, inert gases such as helium, argon, etc. are used. Examples of hydrocarbon carrier gases include acetylene ($C_2H_2$), ethylene ($C_2H_4$), propene ($CH_2$=$CHCH_3$), propyne ($CH_3$C≡CH), 1,2-propadiene ($CH_2$=C=$CH_2$), and Cyclopropene ($H_2$CCHCH).

In one example, the process gas employs a carrier gas but no separate oxygen source (e.g., molecular oxygen, ozone, hydrogen peroxide or carbon dioxide). Examples of the carrier gas include inert gases and hydrogen. In this example, a single precursor provides all the necessary oxygen, silicon, and carbon, including the carbon—carbon triple bonds and/or double bonds. As indicated, siloxanes and various silanes or compounds having silyl groups with hydrocarbon oxy moieties are suitable for this purpose.

In a second process gas example, the carrier gas again provides no oxygen. In this case, however, there are at least two precursor gases. The primary precursor provides oxygen, silicon, and some amount of carbon and hydrogen. Examples of such primary precursors includes TMCTS, DEMS, MTEOS and OMCTS. A secondary precursor is employed to provide the carbon—carbon triple bonds and/or double bonds. Note that in some cases, the carrier gas could be one of the secondary precursor hydrocarbons.

In a third process gas example, the carrier gas supplies some or all of the oxygen. As indicated, examples of suitable oxygenated carrier gases are carbon dioxide, ozone, hydrogen peroxide, molecular oxygen or other oxygen containing molecules. In this third example, only a single precursor is employed. It may or may not include oxygen. In cases where no oxygen is used, it could simply be a hydrocarbon silane material. Preferably, however it includes some degree of unsaturation. More preferably, the unsaturation involves one carbon—carbon triple bond. Examples of suitable precursors for this embodiment include ETMS or TMSA, PTMS, BTMSA, TAS, MSTA, MDEOSA, DMEOSA, DMSDA and VTMS. Any one of these "single precursors" may be used in conjunction with a carrier gas.

In a fourth example of a process gas, oxygen is again supplied in a carrier gas such as carbon dioxide, oxygen, ozone, nitrous oxide, or hydrogen peroxide. However, in this case two or more precursors are employed. At least one of these may be similar to those identified in the second example. However, it is not necessary for oxygen to be present in either the primary or secondary precursors. However, in some embodiments, some amount of oxygen may be present in one or more of these molecules. Many relatively simple hydrocarbon silanes and/or silyl compounds may be employed as the primary precursor.

Process Optimization

Various deposition techniques may be employed to form the CDO dielectric materials of this invention. These include various other forms of chemical vapor deposition (CVD) including plasma enhanced CVD (PECVD) and high-density plasma CVD (HDP CVD). HDP CVD of dielectric materials is described in various sources including commonly assigned U.S. patent application Ser. No. 09/996,619, filed Nov. 28, 2001 by Atiye Bayman et al. and titled "Gap Fill for High Aspect Ratio Structures", which is incorporated herein by reference for all purposes. Additionally, other techniques such as spin on techniques and deposition from supercritical solutions may be employed. But for many applications of this invention, a plasma based CVD process is employed.

Further the deposition conditions may be optimized to promote the crosslinking of incorporated bonds. Without this crosslinking, the film mechanical strength will generally be low due to the fact that an increase in content of methyl group $CH_3$ as a terminating group in the CDO film will reduce the bonding density per volume thus the bonding integrity of the film. With crosslinking, the Si—O—Si matrix structure is strengthened. As a result, the mechanical strength, or the fracture toughness, of the as deposited CDO film will be high.

Compositional bonds formed in CDO film of particular interest to this invention include $S_1$—$CH_2$—Si, Si—C≡C—Si, Si—CH=CH—Si, Si—$CH_2$—$CH_2$—Si and other derivatives of these bonds due to Si, C or O crosslinking, such as Si—O—C≡C—Si, Si—O—CH=CH—Si, Si—C(—H, —OSi)—$CH_2$—Si, etc. It is noted that the chemical bond length and angle varies with the degree of saturation and crosslinking. Nominal bond length of the C—C bond is ~1.5 Å, that of the C=C bond is ~1.3 Å, that of the C≡C bond is ~1.2 Å, and that of the C—O bond is ~1.1 Å while the nominal bond length of the Si—O bond is ~1.6 Å and that of the Si—C bond is ~1.9 Å. It is evident that the incorporation of C≡C bond and its derivatives (C=C, C—C) and their crosslinking within the CDO film will greatly influence the Si—O—Si matrix structure. More specifically, the Si—O—Si bond angle will change significantly as the desired C related bonds are incorporated and crosslinked. Since the Si—O—Si matrix is the backbone structure of the CDO film, the change in Si—O—Si bond angle will increase the nanometer scale pore space in the matrix and thereby decrease the dielectric constant in the matrix.

As discussed above, residual stress can be reduced by incorporating C≡C bonds and its derivatives and promoting cross-linking/bridging in the CDO film. Due to the very reactive nature of carbon—carbon triple bond, there is abundant incorporation of C≡C bond in the as deposited CDO film. To further enhance its incorporation and its crosslinking within the CDO film, one method is to increase ion bombardment during the PECVD deposition. Process conditions that increase ion bombardment may be chosen to increase one or both of (a) the mean energy of ion striking the substrate and (b) the flux of ions reaching the substrate. Physically, these results may be achieved by selecting process conditions that accomplish one of the following: (i) increasing the mean free path of the ions in the plasma, (ii) reducing the distance that an ion must travel before striking the substrate, and (iii) increasing the mean energy or momentum of the ions that strike the substrate surface.

To increase the momentum or energy of ions striking the substrate surface, at least two different process conditions may be manipulated. First, using a dual-frequency reactor of the type described below, one can increase the relative amount of the low frequency component of the RF energy supplied to the reactor. This has the effect of increasing the length of time in a given oscillation during which ions are accelerated in a single direction (toward the wafer surface). Because the ions are exposed to a field in this direction for a longer period of time, they can accelerate to higher speeds and hence strike the substrate with greater momentum. Second, one can pulse the high frequency component of the RF power to accomplish a similar result.

As is well known in the art, in general, high frequency components of the RF power delivered to a reactor control the plasma density and low frequency components produce ion bombardment of the film. The high and low frequency components can be provided at any of a number of suitable frequencies. In a typical process, the LF component is provided in a frequency range of about 100 to 600 kHz, more preferably about 200–500 kHz, for example about 300 kHz. The High Frequency HF component is generally between 2–60 MHz—in one process example, an HF frequency of 13.156 MHz is used.

In one embodiment, the low frequency component of delivered RF power is between about 0 and 90 percent of the total power, and more preferably between about 0 and 60 percent of the total power (e.g., between about 5 and 40 percent). The optimal value will vary depending upon the mean free path of the ions and the various conditions that impact mean free path. In a specific example, the total power delivered is about 800 Watts on 6 200 mm wafers or 0.42 W/cm$^2$ in area density. This value can be varied depending upon the specific application and plasma reactor employed. In many cases, the low frequency component has a power area density of between about 0 W/cm$^2$ and 20 W/cm$^2$, and more preferably between 0 W/cm$^2$ and 1 W/cm$^2$.

In addition to varying the ratio of HFRF to LFRF, the HFRF power may be pulsed at a certain duty cycle, for example pulsing at between 500 Hz and 10 kHz and varying the HFRF duty cycle from 20–80%. This effectively superimposes a low frequency component on the plasma generation power.

Another method that may be used to increase ion bombardment during film deposition is to alter the deposition pressure. This simply increases the mean free path of ions in the deposition chamber. In one embodiment of the invention the deposition pressure is maintained at a pressure of between about 0.5 to 20 Torr, more preferably in the range of about 2–7 Torr.

Still another adjustment that may be used involves varying the gap between the two capacitor plates of the plasma reactor. In the apparatus described below, this involves choosing an appropriate gap between the showerhead (one capacitor plate) and a thermal block (a second capacitor plate) on which the wafer is positioned, thereby reducing the distance between the plasma source and the substrate. This reduces the distance that an ion must travel before striking the substrate. The ideal gap depends on the type of reactor employed and the process conditions. For many situations, the gap is preferably between about 3 and 20 millimeters.

Process optimization also includes setting the proper flow rates of the various compounds in the process gases. Note that the flow rates are chosen depending upon the amount of surface area to be covered. One can scale the flow rates chosen depending upon variations in the area to be deposited, including in situations where the reactor employs fewer or greater number of wafers and possibly employs 300 millimeter wafers as opposed to 200 millimeter wafers. For example, in experiments where six 200 millimeter wafers were used, the total precursor flow rate was 0.5 ml/min to about 10 ml/min. Note that this comprises the total flow rate of all precursors.

The deposition temperature can be tailored to meet the application. For some IC fabrication applications involving copper lines, for example, temperatures below 425 C may be required for intermetal dielectric deposition. In some embodiments, the substrate temperature is maintained between about 300 and 425C (preferably between about 300 and 350C) during CDO film deposition.

EXPERIMENTAL

Various additional experiments were conducted to confirm aspects of this invention. Some of these are presented below.

Figure 3A:
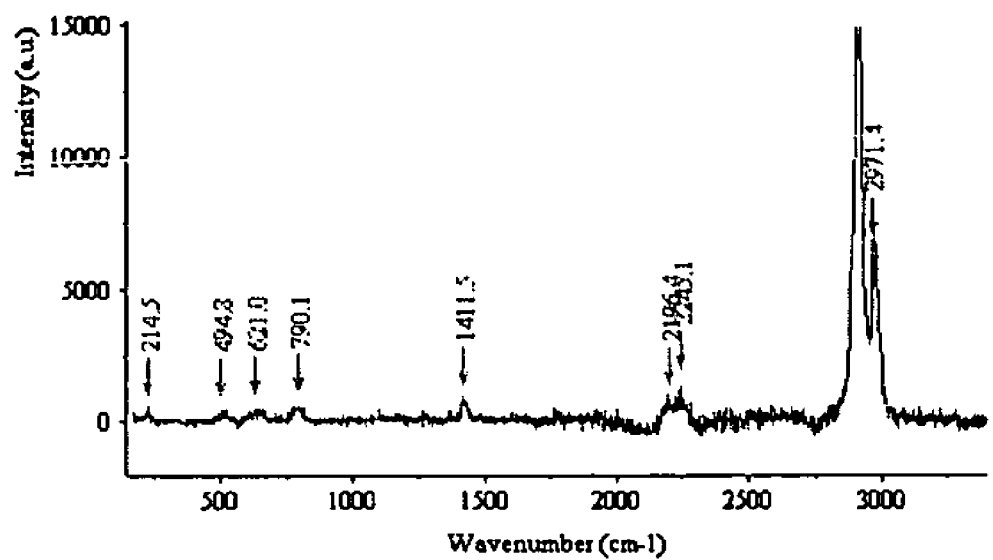
FIGS. 3a and 3b are Raman analysis graphs comparing a film prepared with TMCTS and a film prepared with BTMSA, respectively.
Figure 3B:
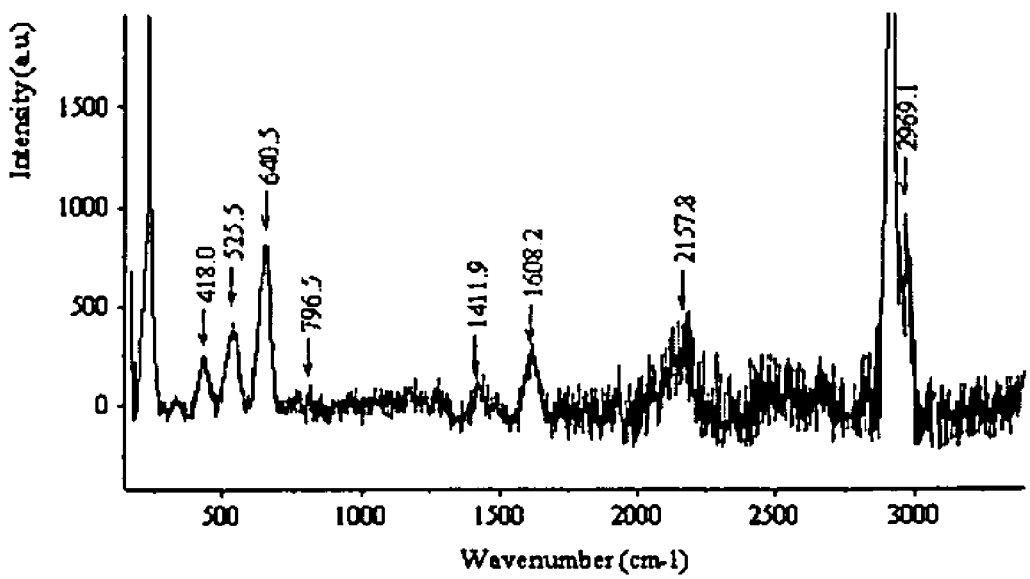

Raman analysis of CDO films has been done. FIG. 3$a$ is a TMCTS and FIG. 3$b$ is a BTMSA based film. As explained, TMCTS is a cyclic tetrasiloxane without any double or triple bonds and BTMSA is a bis(silyl)acetylene. The two films are characterized by strong sharp peaks at 2910 and 2970 cm$^{-1}$, typical for symmetric and antisymmetric stretching of CH$_3$ groups in —Si—CH$_3$ structure, typical for silicones. The band at ~1418 in both spectra may be related with scissoring of —CH$_3$ groups. FIG. 3$a$ (the TMCTS based film) has a peak at 790 cm$^{-1}$ that is due to Si—C stretching similar to the same band in SiC (a transversal optical (TO) band) and silicones. This peak was weak in FIG. 3$b$ (the BTMSA based film), at 796 cm$^{-1}$. A peak at 2100~2245 cm$^{-1}$ in FIG. 3$a$ is likely due to Si—H stretching. FIG. 3$b$ has a band at 1608 cm$^{-1}$ due to —C═C— stretching, which was not detected in the TMCTS based film. A peak in FIG. 3$b$ at ~2250 cm$^{-1}$ is probably due to —C≡C— originating in the BTMSA precursor. These results show that there are —C═C— and —C≡C— bonds in the BTMSA based film, which is consistent with FTIR results. It is believed that the —C═C— and —C≡C— bonds take a key role in lowering CDO residual stress. In FIG. 3$a$, bands at 494 and 621 cm$^{-1}$ are due to —Si—O—Si— vibrations. They probably are shifted in FIG. 3$b$ at 525 and 640 cm$^{-1}$, although the assignment of these bands is not certain.

Figure 4A:
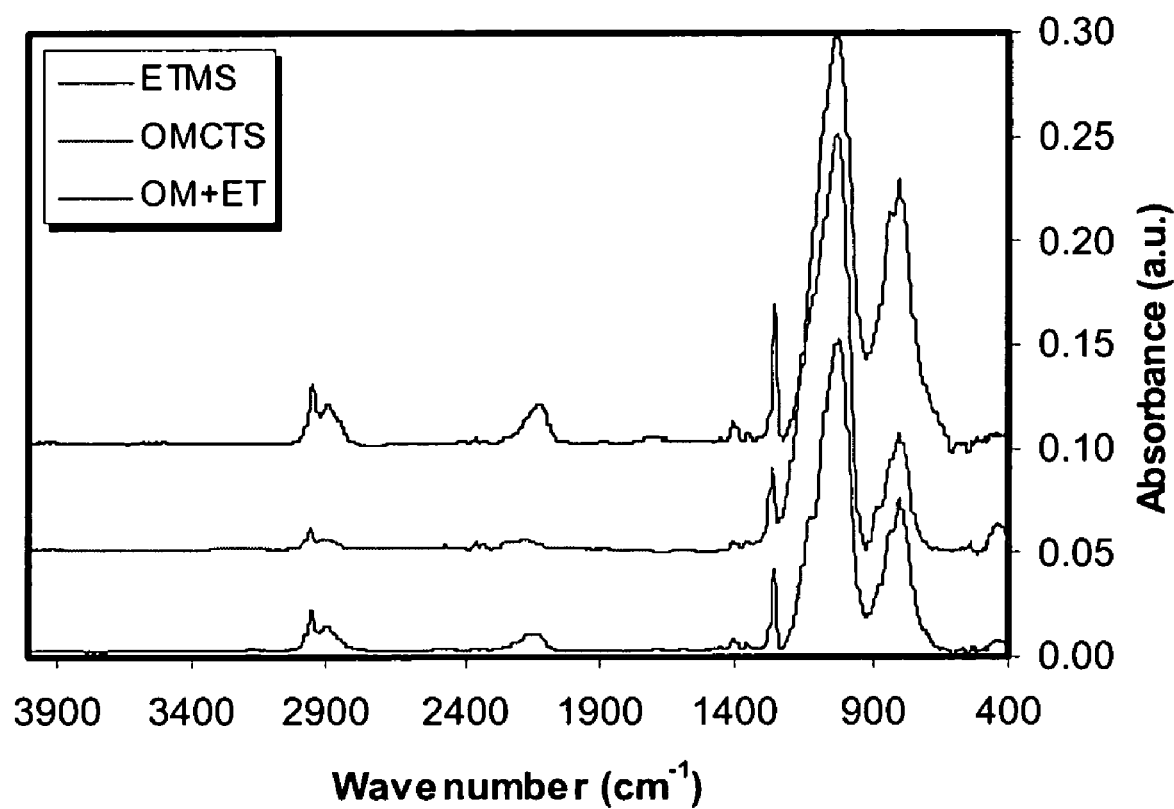
FIG. 4A shows FTIR spectra of ETMS, OMCTS and OMCTS+ETMS films.

FIG. 4A shows FTIR spectra of ETMS, OMCTS and OMCTS+ETMS films, illustrating the chemical structure of the CDO matrix. The FTIR spectra of three CDO films exhibit an absorption peak corresponding to C—H stretch around 2900 to 3000 $cm^{-1}$. For $CH_3$, the symmetric and asymmetric stretches are expected at 2964–2967 and 2907–2909 $cm^{-1}$ respectively.

For methylene groups ($CH_2$), 2933 and 2878 $cm^{-1}$ is assigned as the symmetric and asymmetric stretches, respectively. $CH_3$ symmetric and $CH_2$ asymmetric stretches were observed for all three films at 2955 and 2878 $cm^{-1}$, respectively. The —C≡C— stretching band for the ETMS and OMCTS+ETMS films was observed at 2115 and 2120 $cm^{-1}$, respectively, which suggests that a significant amount of carbon triple bonds were incorporated into the CDO matrix after plasma polymerization. There is no —C≡C— stretching band for OMCTS film but it contains two Si—H stretching bands, which are $(SiO)_3Si$—H and $(CH_3)(SiO)_2$Si—H, observed at 2214 $cm^{-1}$ and 2150 $cm^{-1}$, although they are very weak. The middle peaks around 1250–1280 $cm^{-1}$ in the FTIR spectra of all three films in FIG. 4A are assigned as the Si—$(CH_3)x$ methyl rocking bands at 1270 $cm^{-1}$ for OMCTS film and 1260 $cm^{-1}$ for ETMS and OMCTS+ETMS films. The Si—O stretching bands for all three films were observed at 1022 $cm^{-1}$. The FTIR spectra of all three films also show SiC stretching bands at 796, 873, and 821 $cm^{-1}$. Other peaks related to derivative bonds from the C—C triple bond are also observed from the ETMS based CDO films. These bonds include: Si—CH2—CH2—Si (1160 $cm^{-1}$ and 1270 $cm^{-1}$), C=C (1620–1680 $cm^{-1}$), and CC (2100–2260 $cm^{-1}$).

Figure 4B:
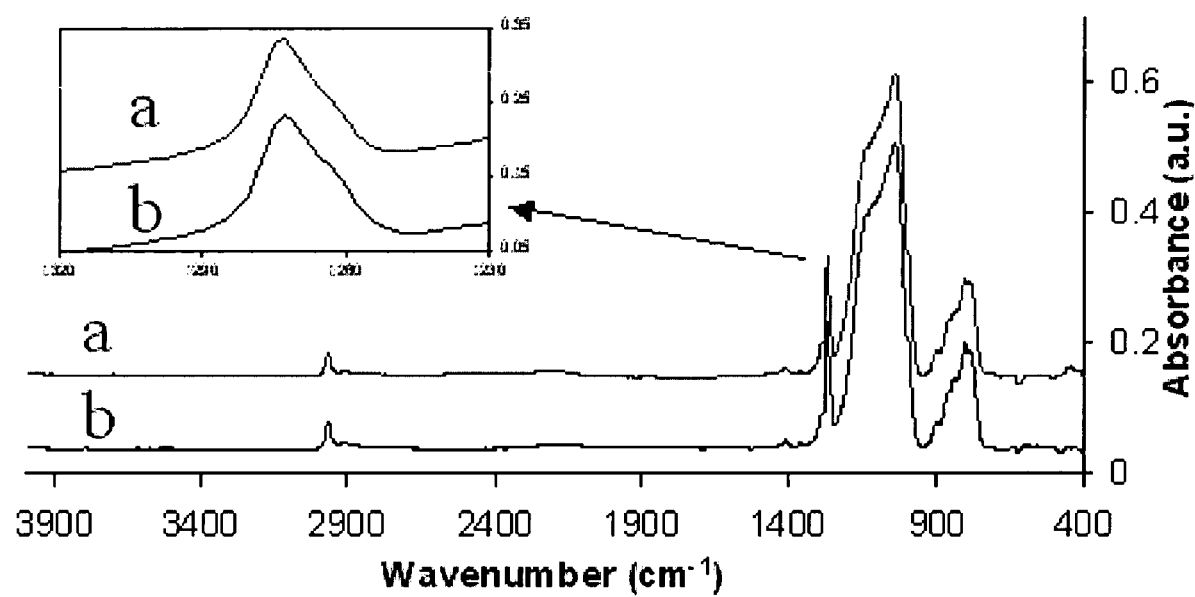
FIG. 4B shows FTIR spectra of TMCTS and TMCTS and ETMS films.

FIG. 4B shows the FTIR spectra of the following OSG films: (a) TMCTS (1 sccm) as precursor, and (b) TMCTS (1 sccm) and ETMS (0.4 sccm) as precursors. The results are similar to those observed in FIG. 4A. Again, the FTIR spectra of the OSG films exhibit an absorption peak corresponding to C—H stretch around 2900 to 3000 $cm^{-1}$. For $CH_3$, the symmetric and asymmetric stretches are expected at 2964–2967 and 2907–2909 $cm^{-1}$ respectively. For methylene groups ($CH_2$), 2933 and 2878 $cm^{-1}$ is assigned as the symmetric and asymmetric stretches, respectively. $CH_3$ symmetric and asymmetric stretches were observed for both films (TMCTS and TMCTS+ETMS) at 2908 and 2968 $cm^{-1}$, respectively. The absence of Si—C≡C—H stretching around 3300 $cm^{-1}$ indicates that the terminal —C≡C—H groups may be connected to the OSG matrix through cross-linking. Two Si—H stretching bands, which are $(SiO)_3$Si—H and $(CH_3)(SiO)_2$Si—H, were observed at 2233 $cm^{-1}$ and 2169 $cm^{-1}$ although they are very weak for both films. The —C≡C— stretching band, normally in the range of 2040–2100 $cm^{-1}$, was too weak to identify in the sample. The middle peaks around 1250–1280 $cm^{-1}$ in the FTIR spectra of TMCTS and TMCTS+ETMS films in FIG. 4B are assigned as the Si—$(CH_3)x$ methyl rocking bands at 1273 and 1263 $cm^{-1}$, respectively, which are also shown in the inset of FIG. 4B. It is clear that the methyl rocking band at 1273 $cm^{-1}$, which is from $(SiO)_3$Si—$CH_3$, is much stronger than the methyl rocking band at 1263 $cm^{-1}$, which is from $(SiO)_2$Si—$(CH_3)_2$. The Si—O stretching bands for both films were observed at 1049 $cm^{-1}$. The FTIR spectra of TMCTS and TMCTS+ETMS films also show SiC stretching bands at 896, 850, 803 and 781 $cm^{-1}$, which are from $Si(CH_3)_2$, $Si(CH_3)_3$, $Si(CH_3)_2$ and $Si(CH_3)$, respectively.

Figure 5:
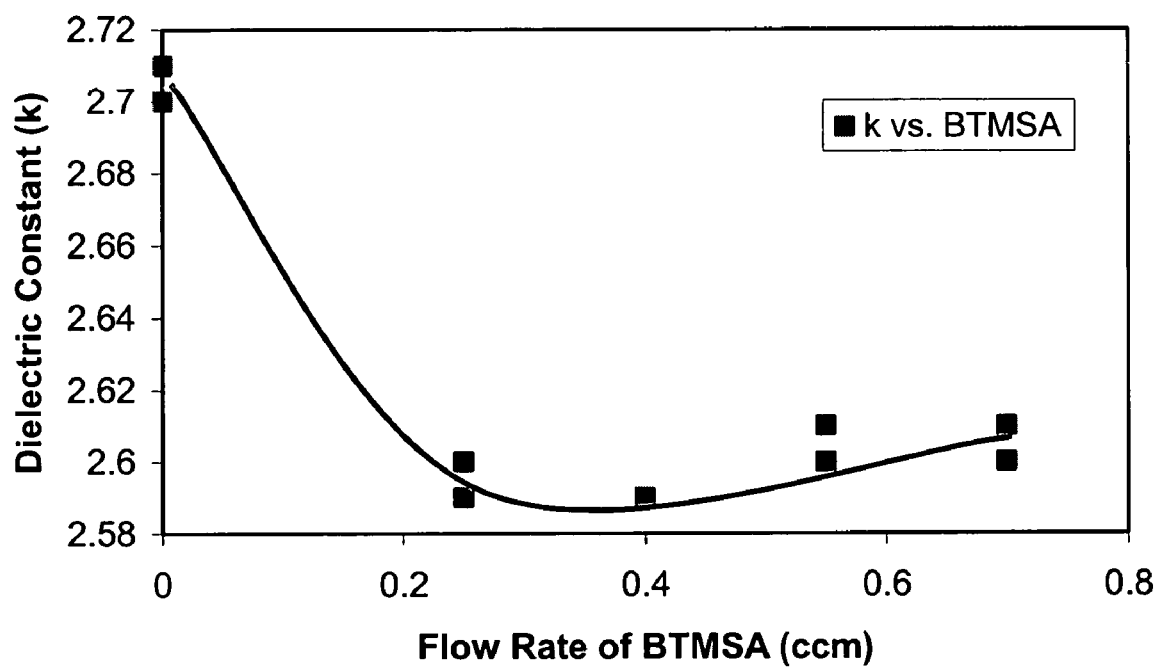
FIG. 5 shows the effect of BTMSA flow rate on dielectric constant.

FIG. 5 shows the effect of BTMSA flow rate on dielectric constant. The data in this figure was taken from films deposited in Sequel® PECVD Chamber, Novellus Systems, Inc. The deposition process was conducted with high frequency RF power of 850 W, a pressure of 7.5 Torr, and a process gas comprising $CO_2$ at 5500 sccm, TMCTS at 1 sccm and BTMSA at the flow rates indicated in the figure. As shown, the dielectric constant decreases rapidly with increasing flow rate of BTMSA in the low flow rate range as shown in FIG. 5, a behavior very similar to that observed for ETMS. Of particular note is the range of 0.25–0.70 sccm BTMSA flow rate. As seen, the dielectric constant increases slightly with increasing flow rate of BTMSA, which could be attributed to the fewer voids and/or higher density in the deposited films when BTMSA flow rate is higher than about 0.4 sccm.

Figure 6:
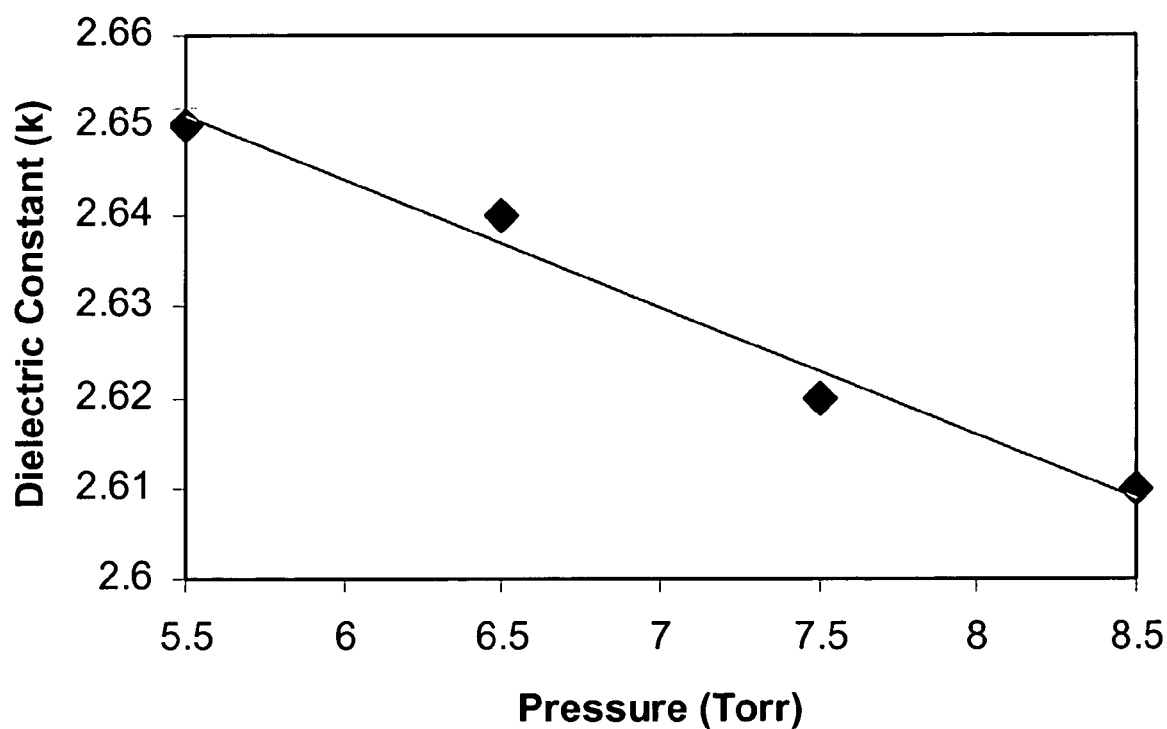
FIG. 6 is a graph illustrating how dielectric constant of deposited CDO films varies as a function of chamber pressure during deposition.

FIG. 6 presents the effect of pressure on dielectric constant. Again deposition was conducted in a Sequel® PECVD Chamber. As shown, the dielectric constant decreases with increasing pressure. The increase in deposition pressure increases the precursor concentration exposed to the substrate and reduces the reaction rate. The reduction in reaction rate increases degree of incorporation of CC triple bonds in the CDO film. This increases the fractional volume of nano voids in the film and lowers the dielectric constant of the CDO film.

Various additional examples will now be presented. These show recipes which yield k value <2.60 (for the first 4 examples) based on KLA-Tencor (San Jose, Calif.) F5 thickness measurement and a Hg probe. In all cases, deposition was conducted in a Sequel® PECVD Chamber.

Example 1

Figure 7:
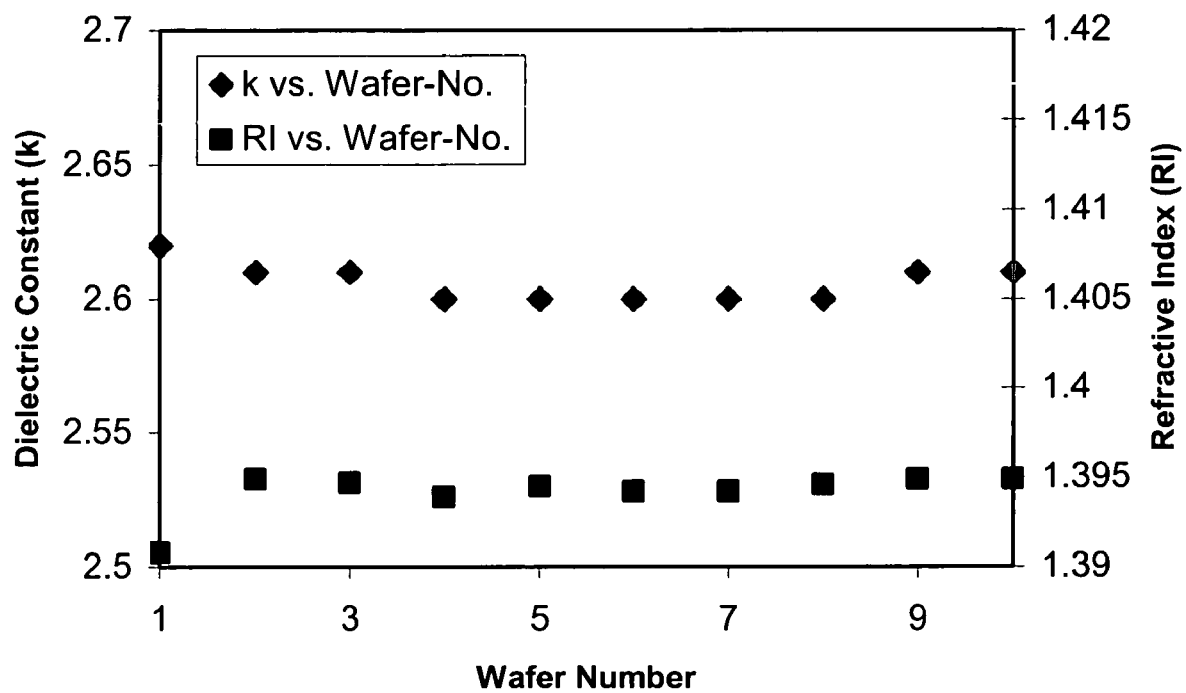
FIG. 7 shows the dielectric constant and refractive index versus wafer number (repeatability).

Plasma was generated with a HFRF (high frequency) power of 750 W during CVD polymerization. LFRF (low frequency) power was set to 0 W. The gas mixture included TMCTS at flow rate of 1 ccm, ETMS at flow rate of 0.4 ccm and $CO_2$ at flow rate of 5500 sccm. The chamber pressure was kept at 7.5 Torr. The film had a dielectric constant of 2.60 for the as-deposited conditions. Process repeatability is illustrated in FIG. 7, indicating that dielectric constant can be reproducible at k=2.60+/−0.01.

Example 2

In this example, the plasma was operated at a HFRF power of 800 W, LFRF power at 0 W and a chamber pressure of 8.5 Torr was used. A gas mixture of TMCTS flow rate of 1 ccm, ETMS flow rate of 0.4 ccm and $CO_2$ flow rate of 4500 sccm was used during CVD polymerization. The as-deposited film had a dielectric constant of 2.58.

Example 3

In this example, the plasma was operated at an RF power of 800 W with a chamber pressure of 11.5 Torr. A gas mixture of TMCTS flow rate of 1 ccm, ETMS flow rate of 0.4 ccm and $CO_2$ flow rate of 5500 sccm was used during CVD polymerization. The as-deposited film had a dielectric constant of 2.54.

Example 4

In this example, a different secondary precursor was used for this process. The plasma was operated at a HFRF power of 850 W, LFRF of 0 W with a chamber pressure of 7.5 Torr. A gas mixture including TMCTS flow rate of 1 ccm, BTMSA flow rate of 0.4 ccm and $CO_2$ flow rate of 5500 sccm was used during CVD polymerization. The as-deposited film had a dielectric constant of 2.59.

Example 5

In this example, the HFRF power was set at 1200 W, and the LFRF at 300 W, in a Sequel chamber. A chamber pressure of 7 Torr was used in this process. The gas mixture of BTMSA flow rate of 2.0 ccm and $CO_2$ flow rate of 3000 sccm was used during PECVD deposition at 350C. The as-deposited film had a dielectric constant of 2.69 and a low tensile stress of 24 MPa. The critical cracking thickness of this film was >5 μm.

Example 6

In this example, the HF RF power was set at 1000 W and no LF RF power was used in a Sequel® chamber. A chamber pressure of 7 Torr was used in this process. The gas mixture of ETMS flow rate of 1.5 ccm and $CO_2$ flow rate of 4000 sccm was used during PECVD deposition at 400C. The as-deposited film had a dielectric constant of 2.61 and stress of 35.55 Mpa (tensile). The critical cracking thickness of this film is 3 μm.

Example 7

In this example, the HF RF power was set at 3000 W and LF RF power at 200 W in a Novellus Vector® chamber which can be used to deposit films on four 300 mm wafers simultaneously. A chamber pressure of 5.5 Torr was used in this process. The gas mixture of TMSA flow rate of 2.5 ccm, $CO_2$ flow rate of 4000 sccm and $O_2$ flow rate of 200 sccm was used during PECVD deposition at 400C. The as-deposited film had a refractive index (RI) of 1.45, a dielectric constant of 2.71 and stress of 43 Mpa (tensile). The critical cracking thickness of this film is >5 μm.

Apparatus

The present invention can be implemented in many different types of apparatus, such as chemical vapor deposition (CVD) reactors and spin-coating systems. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). In one embodiment, a wafer undergoing dielectric deposition is transferred from one station to another within the reactor during the process. While in process, each wafer is held in place by a pedestal, wafer chuck and/or other wafer holding apparatus. For certain operations in which the wafer is to be heated, the apparatus may include a heater such a heating plate. In a preferred embodiment of the invention, a PECVD (Plasma Enhanced Chemical Vapor Deposition) system, but other forms of CVD may be used as well, for example a HDP CVD (High Density Plasma Chemical Vapor Deposition) system.

Figure 8:
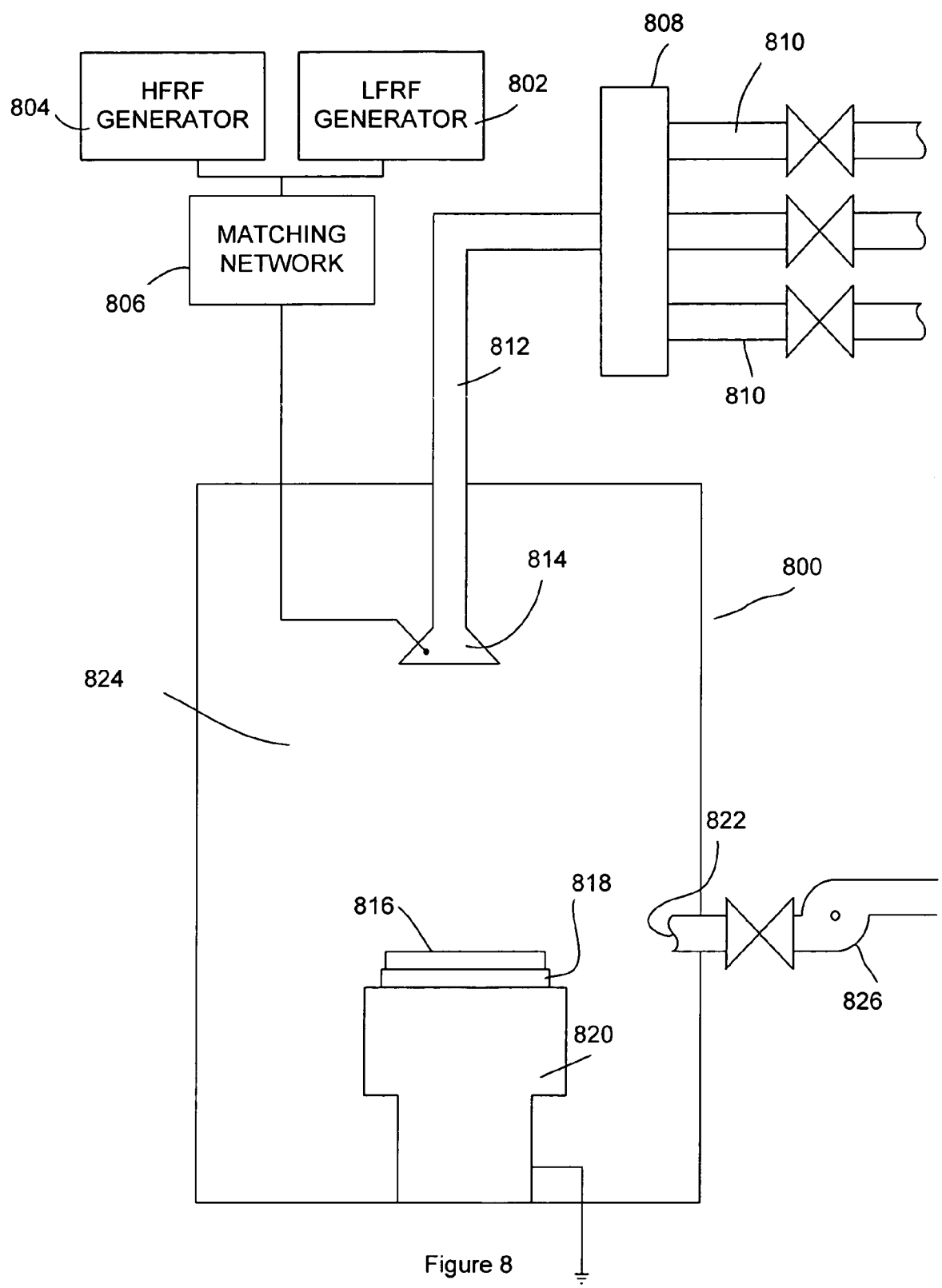
FIG. 8 provides a simple block diagram depicting various reactor components arranged as in a conventional reactor.

FIG. 8 provides a simple block diagram depicting various reactor components arranged for implementing the present invention. As shown, a reactor 800 includes a process chamber 824, which encloses other components of the reactor and serves to contain the plasma generated by a capacitor type system including a showerhead 814 working in conjunction with a grounded heater block 820. A high-frequency RF generator 802 and a low-frequency RF generator 804 are connected to a matching network 806 that, in turn is connected to showerhead 814. The power and frequency supplied by matching network 806 is sufficient to generate a plasma from the process gas, for example 800W total energy.

Within the reactor, a wafer pedestal 818 supports a substrate 816. The pedestal typically includes a chuck, a fork, or lift pins to hold and transfer the substrate during and between the deposition reaction. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be premixed or not. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 800 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

Applications

This invention broadly applies to deposition of low-k low residual stress CDO dielectric material on any type substrate. In many cases, however, the CDO dielectric material will be used in integrated circuits or other electronic devices. A preferred use for the CDO films of this invention is for interlayer dielectric (ILD) applications (including both inter-level dielectrics (between active devices and the first metallization layer and intermetal dielectrics ("IMD" between adjacent metallization layers)). In these applications, the CDO films serve to replace conventional silicon dioxide or fluorinated silica glass (FSG) materials. Examples of non-ILD applications include barrier and etch-stop (ES) layers, antireflective layers (ARL), hardmask layers, etc. In conventional systems, these layers are sometimes provided in the form of oxygen-doped carbides (which have a refractive index value of not greater than about 1.6.)

The ultimate thickness of a CDO dielectric film produced in accordance with this invention depends upon the application. For example, the final thickness for an interlayer dielectric or packaging application may range from 400 Angstroms to about 2 to 3 micrometers. In some cases, extra thickness is required to provide some amount of sacrificial dielectric to accommodate a subsequent planarization step.

In a preferred embodiment, the CDO films produced in accordance with this invention are used in multiple metallization layers. Such devices may have, for example, five or more metallization layers and five or more associated CDO films.

OTHER EMBODIMENTS

While this invention has been described in terms of certain embodiments, there are various alterations, modifications, permutations, and substitute equivalents, which fall within the scope of this invention. It should also be noted that there are many alternative ways of implementing the methods and apparatuses of the present invention. Further, there are numerous applications of the present invention, both inside and outside the integrated circuit fabrication arena. It is therefore intended that the following appended claims be interpreted as including all such alterations, modifications, permutations, and substitute equivalents as fall within the true spirit and scope of the present invention.

What is claimed is:

1. A method of preparing a carbon doped silicon oxide (CDO) film on a substrate, the method comprising:
   (a) providing the substrate to a deposition chamber; and
   (b) contacting the substrate with a primary CDO precursor and a secondary CDO precursor, wherein the primary CDO precursor is an alkylsiloxane and wherein the secondary precursor contains a carbon—carbon triple bond, under process conditions whereby the CDO film is formed on the substrate, and whereby the CDO film contains carbon—carbon triple bonds and the CDO film has a dielectric constant of less than 2.7,
   wherein the secondary CDO precursor comprises one or more compounds selected from the list consisting of Ethynyltrimethylsilane (ETMS), Propargyltrimethylsilane (PTMS), Propargyloxytrimethylsilane (POTMS), Bis(trimethylsilyl)acetylene (BTMSA), 1,3-Diethynyltetramethyldisiloxane (DTDS), Dimethylmethoxysilaneacetylene (DMMOSA), Methyldimethoxysilaneacetylene (MDMOSA), Dimethylethoxysilaneacetylene (DMEOSA), Methyldiethoxysilaneacetylene (MDEOSA), Ethyldiethoxysilaneacetylene (EDEOSA), and Dimethylsilane-diacetylene (DMSDA).

2. The method of claim 1, wherein the CDO film has a dielectric constant of not greater than about 2.6.

3. The method of claim 1, wherein the substrate is a partially fabricated integrated circuit.

4. The method of claim 3, wherein the CDO film is an interlayer dielectric in an integrated circuit.

5. The method of claim 1, wherein the deposition chamber comprises one or multiple stations that allow processing one or multiple substrates in parallel.

6. The method of claim 1, wherein the CDO film is formed on the substrate by a chemical vapor deposition process.

7. The method of claim 1, wherein the CDO film is formed on the substrate by a plasma enhanced chemical vapor deposition (PECVD) process.

8. The method of claim 1, wherein the primary CDO precursor comprises an alkylcyclotetrasiloxane.

9. The method of claim 1, wherein the CDO precursors are provided in a carrier gas.

10. The method of claim 9, wherein the carrier gas comprises one or more gases selected from the group consisting of carbon dioxide, oxygen, ozone, nitrous oxide and hydrogen peroxide.

11. The method of claim 9, wherein the carrier gas comprises one or more gases selected from the group consisting of helium, argon, and other inert gases.

12. The method of claim 1, wherein the as deposited CDO film has a carbon—carbon triple bond to silicon-oxygen bond ratio of about 0.05% to 20% based on FTIR peak areas.

13. The method of claim 12, where the as deposited CDO film also contains derivative bond structures of carbon—carbon triple bonds, wherein the derivative bond structures include one or more of the following: carbon—carbon double bonds, carbon—carbon single bonds, and their crosslinked forms within the Si—O—Si matrix.

14. The method of claim 1, wherein the CDO film has a carbon-carbon triple bond to silicon oxide bond ratio of about 0.3% to 7% based on FTIR peak area.

* * * * *